United States Patent [19]

Schiffmann

[11] Patent Number: 5,144,645
[45] Date of Patent: Sep. 1, 1992

[54] CIRCUIT APPARATUS FOR GENERATING A SYMMETRICAL PULSE SEQUENCE OF VARIABLE FREQUENCY

[75] Inventor: Rolf Schiffmann, Mainz, Fed. Rep. of Germany

[73] Assignee: BTS Broadcast Television Systems GmbH, Darmstadt, Fed. Rep. of Germany

[21] Appl. No.: 715,542

[22] Filed: Jun. 14, 1991

[30] Foreign Application Priority Data

Jul. 2, 1990 [DE] Fed. Rep. of Germany ....... 4020977

[51] Int. Cl.⁵ ........................................... H03B 19/10
[52] U.S. Cl. ...................................... 377/47; 328/20; 307/273
[58] Field of Search .......................... 377/47; 328/20; 307/219.1, 273

[56] References Cited

U.S. PATENT DOCUMENTS

| | | | |
|---|---|---|---|
| 3,838,344 | 9/1974 | Tanimoto | 328/20 |
| 3,909,717 | 9/1975 | Gazzano | 328/20 |
| 4,398,153 | 8/1983 | Rittenbach | 328/20 |
| 4,439,689 | 3/1984 | Chazenfus | 307/273 |
| 4,596,954 | 6/1986 | Haque | 328/20 |

Primary Examiner—John S. Heyman
Attorney, Agent, or Firm—Frishauf, Holtz, Goodman & Woodward

[57] ABSTRACT

A monostable multivibrator having a time constant that is approximately one-quarter of the period of a pulse signal supplied to its input is used for frequency doubling of a 50% keying ratio input pulse signal. The output signals of the multivibrator are low-pass filtered and supplied to inputs of a different amplifier operating as a difference integrator by virtue of a capacitance connected between its output and its inverting input. This output is utilized to modify the time constant when the period of the input pulse sequence becomes more than about four times the time constant of the multivibrator, thus keeping the keying ratio of the output signals at 50% over a wide range of variation of the frequency of the usually symmetrically input pulse sequence. The multivibrator is connected so as to be triggered by both rising and falling flanks of the input pulses. Both ECL and TTL embodiments are shown.

4 Claims, 2 Drawing Sheets

CIRCUIT APPARATUS FOR GENERATING A SYMMETRICAL PULSE SEQUENCE OF VARIABLE FREQUENCY

This invention concerns a circuit for generating a symmetrical output pulse signal having a constant duty cycle (keying ratio) of 50% and having a frequency of twice that of an input pulse sequence frequency. More particularly, it concerns a circuit utilizing a monostable multivibrator which is triggered by positive and negative flanks of the input pulse signal and which has a time constant that corresponds to about one-fourth of a pulse period of the input signal.

A frequency doubler is known from EP 0 155 041 A2 equivalent to U.S. Pat. No. 4,596,95, which generates a pulse signal having a keying ratio of 50%. In this known frequency doubler circuit an exclusive-OR gate is used, to one input of which the inputs signal of the frequency doubler circuit is supplied directly and to another input of which that input signal is applied with a certain delay. A pulse signal of the double frequency is available at the output of the EX-OR gate. The keying ratio of the resulting pulse signal is determined essentially by the amount of delay of a delay circuit or component. The pulse signal obtained from the exclusive-OR correlation is then converted into a ramp shape signal and supplied to one input of a comparator. At another input of the comparator there is applied a voltage which is derived from the signal produced at the output of the comparator. This known frequency doubling circuit can follow an input signal which fluctuates in the pulse frequency only when that fluctuation is within a small range. When the fluctuation exceeds that small range, the keying ratio of the output signal is not constant at 50%. Furthermore, this known circuit is suitable only for processing input pulse signals of relatively low frequency.

THE INVENTION:

It is an object of the present invention to provide circuit apparatus of that described above in which the variable pulse frequency of an input pulse signal can be doubled over a great frequency range with a constant output keying ratio of 50%.

Briefly, two low pass filters are respectively connected to the inverting and non-inverting signal outputs of the monostable multivibrator. The output of the two low pass filters are connected to a subtracting device, of which the output signal is supplied to a device for influencing the time constant of the multivibrator in a manner depending on the output signal of the subtracting device.

In the circuit apparatus of the invention the keying ratio of the frequency doubled output pulse signal remains constant even with change of more than 30% in the pulse sequence frequency of the input pulse signal. In addition, the circuit apparatus of the invention requires no compensation or calibration and is suitable for doubling high frequency signals, as for example, color carrier frequency signals having a frequency of 4.43MHz.

It is advantageous for the subtraction device to consist of a difference integrator in which the inverting input of a differential amplifier is connected by a capacitor with the output of the differential amplifier, and in which the low-pass filtered signal of the non-inverting output of the monostable multivibrator is supplied to the non-inverting input of the differential amplifier through a resistance, and in which also the low-pass filtered signal of the inverting output of the monostable multivibrator is applied to the non-inverting input of the differential amplifier.

It is also advantageous to utilize a monostable multivibrator having a time constant determined by a combination of a resistance and a capacitor and to modify the time constant by the emitter-collector path of a transistor connected in series with the resistance of the resistance-capacitor combination, the transistor having its base connected through a resistance to the output of the subtraction device.

When a monostable multivibrator is used which has a control input for change of the time constant by voltage or current control, it is convenient to connect that control input through a resistance to the subtraction device for receiving its output signal.

DRAWINGS

The invention is further described by way of illustrative example with reference to the annexed drawings, in which.

DESCRIPTION OF THE ILLUSTRATED EMBODIMENTS

Figure 1:
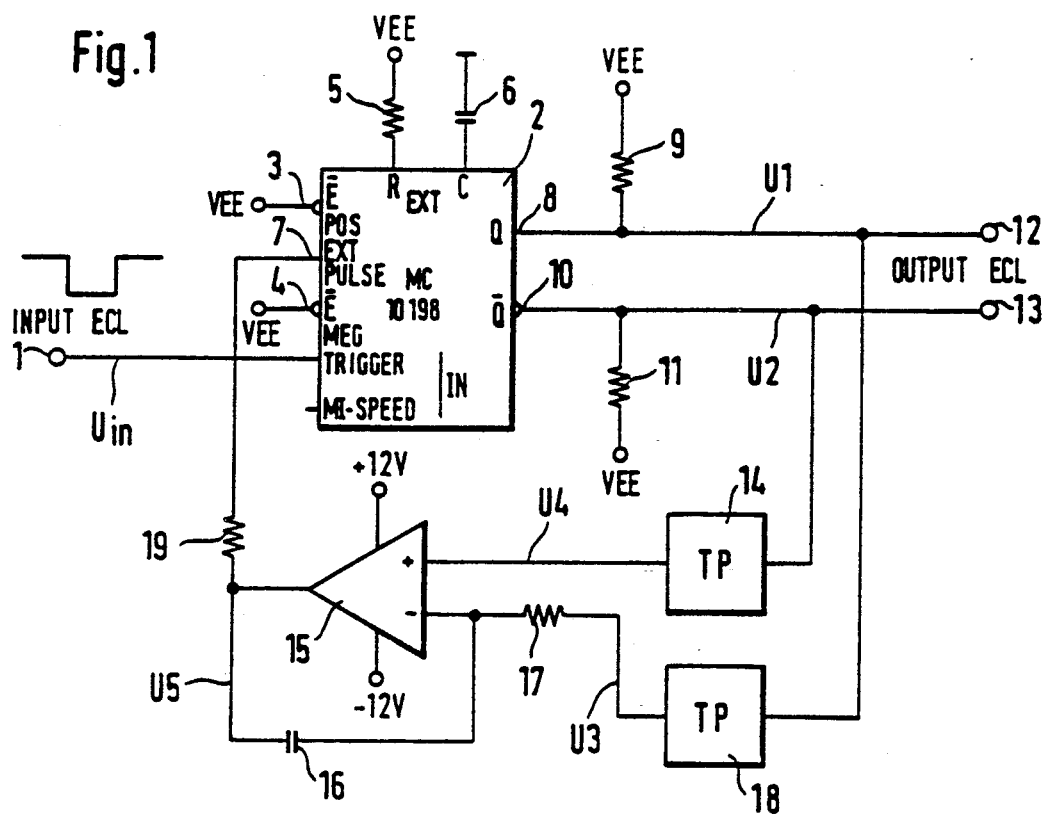
FIG. 1 is a circuit block diagram of apparatus according to the invention having a multivibrator operating in ECL electronic logic.

In a first embodiment the circuit apparatus of the present invention as shown in FIG. 1, an input pulse signal $U_{in}$, which utilizes the signal levels of emitter-coupled logic (ECL) is supplied to a monostable multivibrator 2, which in the illustrative case is of the type MC10198 available from the manufacturer Motorola. The monostable multivibrator 2 for ECL operation has two control inputs 3 and 4, both of which are connected to a potential VEE, so that at every flank transition of the input pulse signal $U_{in}$, the monostable multivibrator 2 will be triggered. The time constant of the multivibrator 2 is prescribed by a resistance 5 connected to the potential VEE and to a capacitor 6 of which the other terminal is connected to ground or reference potential. The prescribed time constant can be varied within certain limits by a voltage supplied to an input 7. At an non-inverting output 8, which is connected through an output resistance 9 to the potential VEE, and likewise at an inverting output 10 connected through an output resistance 11 to the potential VEE, there are terminals 12 and 13 from which output pulse signals can be obtained U1 and U2, which are the inverse of each other and use the ECL levels.

The inverted output signal U2 is transmitted through a low pass filter 14 to the non-inverting input of an operational amplifier 15. The operational amplifier 15 is made to function as a difference integrator by means of an external connection of a capacitor 16 and of an input series resistance 17 at its inverting input. The non-inverting output signal 1 is applied to the resistance 17 through a low pass filter 18. The output of the operational amplifier 15 is connected through a resistance 19 with the above-mentioned input 7 of the monostable multivibrator 2.

Figure 3:
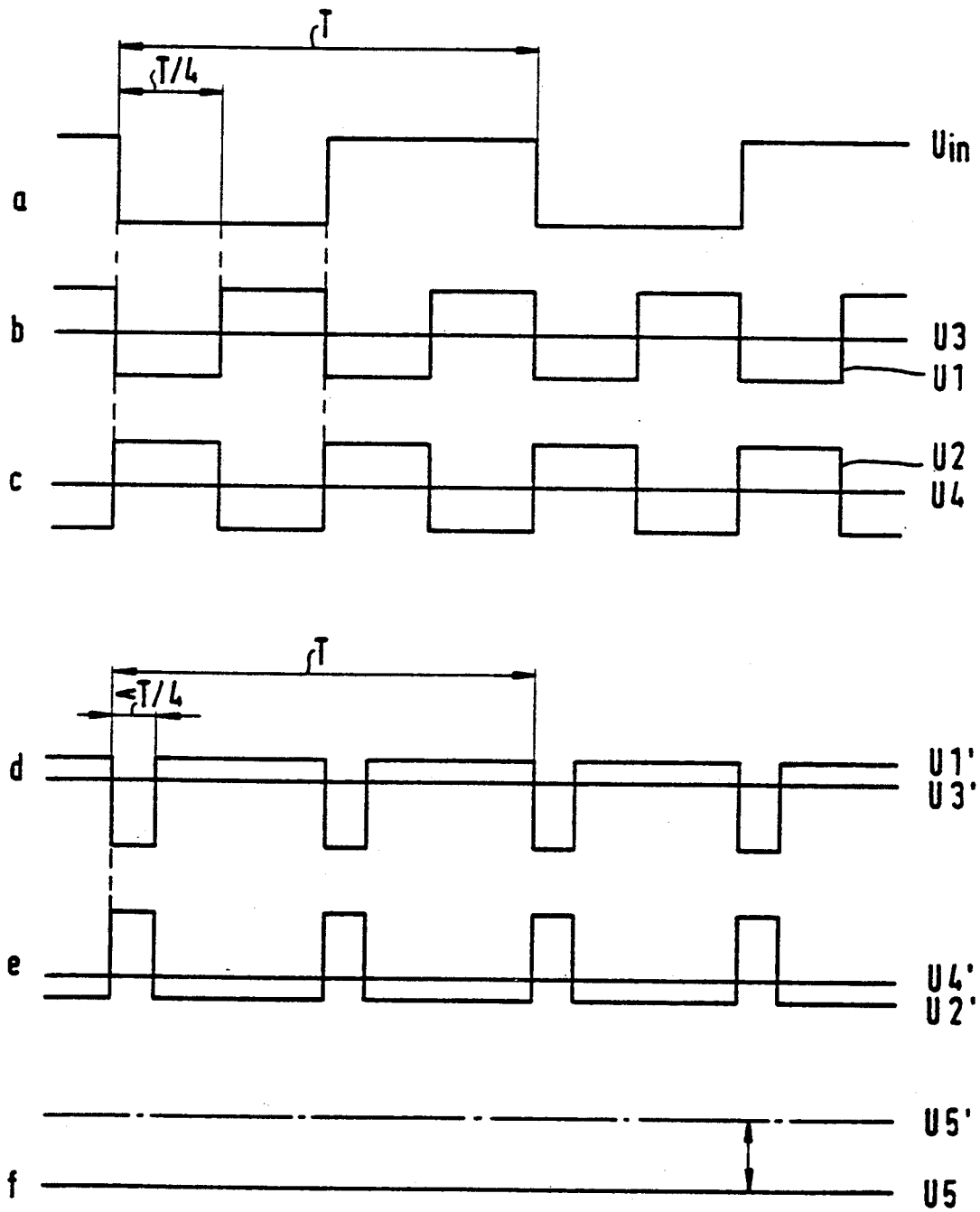
FIG. 3 is a timing diagram showing, to the same time scale, pulse graphs a, b, c, d and e, and a voltage course graph f.

The electrical function of the circuit apparatus shown in FIG. 1, will now be explained by reference to the voltage-time diagrams of FIG. 3. It is assumed that an input signal which has the symmetrical course as shown in line a of FIG. 3 is applied to the terminal 1 of FIG. 1. It is further assumed that the time constant of the monostable multivibrator 2 is so chosen that it corresponds to about one-quarter of a pulse period T of the signal supplied to the input 1. At every signal flank transition the monostable multivibrator 1 flops into a metastable state for a time duration of T/4, and after that time interval has run out it flops back into a quiescent state. At the outputs 8 and 10 of the monostable multivibrator 2, the output pulse signals U1 and U2 are made available, which have the meander-shaped course shown in lines b and c of FIG. 3.

As a result of subsequent low-pass filtering by the low pass filters 14 and 15, of which the cutoff frequencies are very low compared to the highest pulse sequence frequency of the output pulse signals U1 or U2, there are produced average value voltages U3 and U4 at the filter outputs. In the illustrated case, the average value voltages U3 and U4 are alike and opposite. That is because the output pulse signals have a keying ratio of 50%. At the output of the differential integrator 15, 16, 17 there is therefore a constant voltage U5. The course of the voltage U5 is shown in line f, at the bottom of FIG. 3, as a solid line. As a result of that kind of a voltage value for the voltage U5, the time constant of the monostable multivibrator 2 is not changed.

In the case in which the time constant prescribed by the resistance 5 and the capacitor 6 does not correspond to one-quarter of the pulse period T, as a result of a change of the input pulse sequence frequency at the terminals 1, the average values of the two voltages U3 and U4 deviate from each other. The voltage-time diagrams of lines d and e of FIG. 3 bring out this situation. The time constant set for a particular nominal pulse sequence frequency is in this case smaller than one-quarter of the pulse T. Output signals U1' and U2' continue to have twice the pulse sequence frequency of the input pulse signal, but the desired keying ratio of 50% is not present. Low-pass filtering of the signals U1' and U2' leads to a corresponding level change of the voltages U3' and U4', so that the chain dotted line in the graph of FIG. 3 shows the course of the voltage U5' at the output of the difference integrator 15, 16, 17. This change of voltage level produces a change of the prescribed time constant and thereby a correction of the keying ratio in the direction of the desired keying ratio of 50%.

By the symmetrical evaluation of the available mutually inverse output signals U1 and U2, the circuit apparatus of the invention is highly reliable in operation. Ripples that may be present on the low-pass filter signals U3 and U4 are completely compensated by the difference integrator 15, 16, 17. Timewise jitter in the output signals U1 and U2 is avoided.

Figure 2:
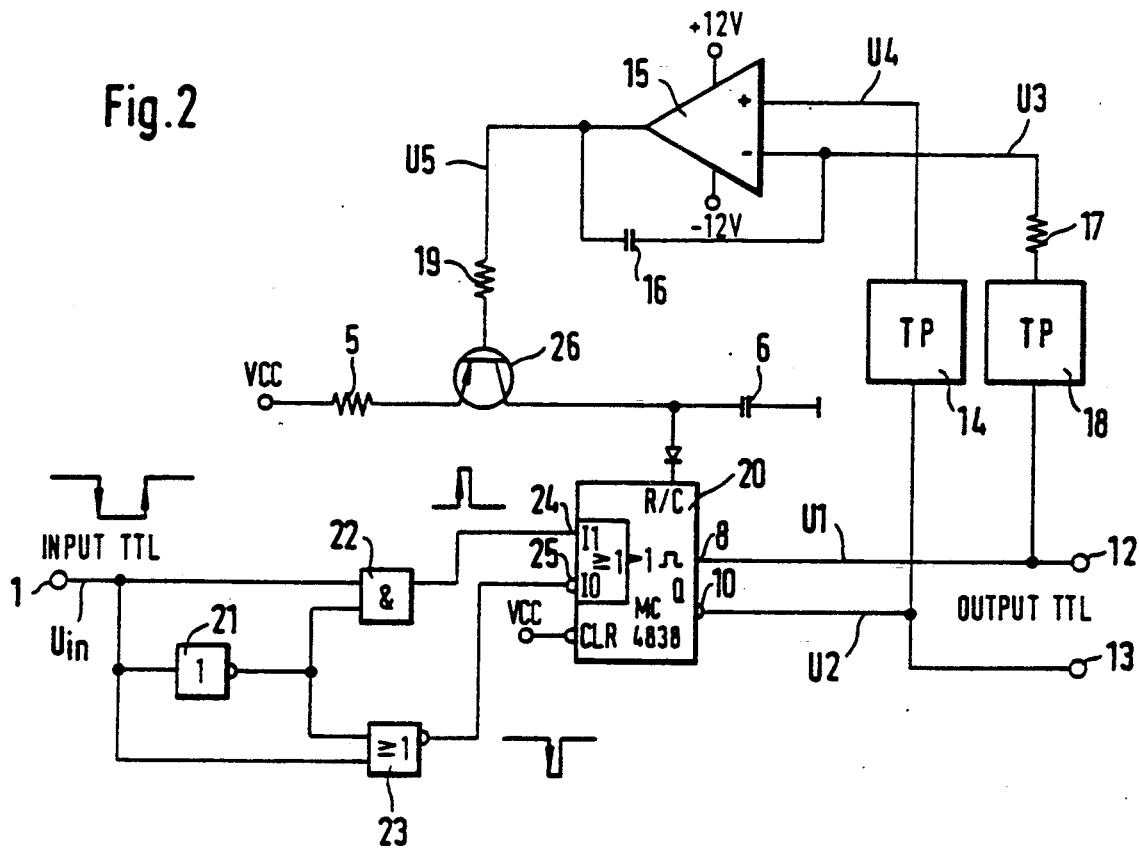
FIG. 2 is a circuit block diagram of apparatus according to the invention utilizing a monostable multivibrator operating in TTL/CMOS electronic logic.

A second embodiment of the circuit apparatus of the invention is shown in FIG. 2. In FIGS. 1 and 2, the same elements are provided with the same reference numerals. In FIG. 2, instead of a monostable multivibrator 2 for ECL operation, this embodiment has a monostable multivibrator 20 for CMOS levels sometimes designated as TTL. This multivibrator may, for example, be of the type HC4538 available from the manufacturer Texas Instruments. Since this CMOS multivibrator cannot be triggered at the same time by positive and negative flanks of an applied input pulse signal, the trigger inputs of the monostable multivibrator 20 has logic components 21, 22 and 23 located ahead of its inputs which, according to the direction of a flank condition in the input pulse signal, trigger corresponding inputs 24 and 25 of the monostable multivibrator. Since the monostable multivibrator 20 also has no separate input for change of the time constant provided by the resistance 5 and the capacitor 6, the emitter-collector path of a transistor 26 is interposed in series with the resistance 5, between the resistance 5 and the connection to the multivibrator to which the capacitor 6 is also connected. In dependence on the voltage U5 applied to the base electrode of the transistor 26, the emitter-collector path of the transistor 26 changes its resistance and thereby the time constant of the monostable multivibrator 20. The regulation for holding constant the keying ratio of the output voltages U1 and U2 supplied by the output of the monostable multivibrator 6 takes place in the manner already described in connection with FIG. 1.

Although the invention has been described with reference to particular illustrative examples, it will be understood that modifications and variations are possible within the inventive concept.

I claim:

1. Circuit apparatus for producing a symmetrical output pulse signal having a constant keying ratio of 50% and also having twice the pulse sequence frequency of an input pulse signal, said apparatus including a monostable multivibrator capable of being triggered by positive and negative flanks of an input pulse signal and having a time constant which is approximately one-quarter of a pulse period of said input pulse sequence, further comprising:

first and second low pass filters (14, 18) having respective outputs and respectively having inputs connected to the inverting and non-inverting signal outputs (8,10) of said monostable multivibrator (2, 20);

subtraction means having inputs respectively connected to outputs of said first and second low pass filters and having an output providing a signal representative of the difference between said signals at said outputs of said low pass filters; and means (26) for modifying the time constant of said multivibrator in response to said output of said subtraction device.

2. The circuit apparatus of claim 1, wherein said subtraction device is constituted by a difference integrator composed of a differential amplifier (15) having an output, having inverting and non-inverting inputs, and having a capacitor connected between said output and said inverting input, and wherein the output of said second low-pass filter is connected through a resistance (17) to said inverting input of said differential amplifier (15) and the output of said first low-pass filter is connected to the non-inverting input of said differential amplifier.

3. The circuit apparatus of claim 1, wherein a resistance-capacitor circuit (5, 6) is provided and is connected to said multivibrator (20) for setting the time constant of said multivibrator and wherein, for modifying said time constant there is interposed in said resistance-capacitor circuit, in series with said resistance and said capacitance, an emitter-collector path of a transistor (26) having its base electrode connected through a second resistance (19) to said output of said subtraction device (15, 16, 17) for changing the resistance of said emitter-collector path.

4. The circuit apparatus of claim 1, wherein said monostable multivibrator (2) has a control input for changing its time constant in response to electric current or electric voltage and wherein the signal provided at said output of said subtraction device is connected through a resistance (19) to said control input (7) of said multivibrator (2).

* * * * *